(12) United States Patent
Wirbeleit et al.

(10) Patent No.: US 7,569,437 B2
(45) Date of Patent: Aug. 4, 2009

(54) FORMATION OF TRANSISTOR HAVING A STRAINED CHANNEL REGION INCLUDING A PERFORMANCE ENHANCING MATERIAL COMPOSITION UTILIZING A MASK PATTERN

(75) Inventors: Frank Wirbeleit, Dresden (DE); Andy Wei, Dresden (DE); Roman Boschke, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 104 days.

(21) Appl. No.: 11/688,946

(22) Filed: Mar. 21, 2007

(65) Prior Publication Data
US 2008/0023692 A1    Jan. 31, 2008

(30) Foreign Application Priority Data
Jul. 31, 2006    (DE) .................. 10 2006 035 669

(51) Int. Cl.
*H01L 21/00* (2006.01)
(52) U.S. Cl. ................ 438/153; 438/186; 438/197; 438/299; 257/E21.431; 257/E21.446
(58) Field of Classification Search .............. 438/153, 438/186, 197, 299; 257/E21.431, E21.446
See application file for complete search history.

(56) References Cited

U.S. PATENT DOCUMENTS

| | | | |
|---|---|---|---|
| 6,605,498 B1 | 8/2003 | Murthy et al. | 438/197 |
| 2004/0126998 A1 | 7/2004 | Feudel et al. | 438/514 |
| 2005/0023520 A1 | 2/2005 | Lee et al. | 257/19 |
| 2006/0003561 A1 | 1/2006 | Goktepeli | 438/528 |
| 2006/0030093 A1* | 2/2006 | Zhang et al. | 438/197 |
| 2006/0060893 A1 | 3/2006 | Chakravarthi et al. | 257/269 |
| 2006/0138542 A1 | 6/2006 | Xiang | 257/347 |

FOREIGN PATENT DOCUMENTS

WO    2005/023520    7/2005

OTHER PUBLICATIONS

Communication Dated Jul. 5, 2007 for serial No. 10 2006 035 669. 1-33.

\* cited by examiner

*Primary Examiner*—Thanh V Pham
(74) *Attorney, Agent, or Firm*—Williams, Morgan & Amerson, P.C.

(57) ABSTRACT

By forming a semiconductor alloy in a silicon-based active semiconductor region prior to the gate patterning, material characteristics of the semiconductor alloy itself may also be exploited in addition to the strain-inducing effect thereof. Consequently, device performance of advanced field effect transistors may be even further enhanced compared to conventional approaches using a strained semiconductor alloy in the drain and source regions.

11 Claims, 5 Drawing Sheets

FORMATION OF TRANSISTOR HAVING A STRAINED CHANNEL REGION INCLUDING A PERFORMANCE ENHANCING MATERIAL COMPOSITION UTILIZING A MASK PATTERN

BACKGROUND OF THE INVENTION

1. Field of the Invention

Generally, the subject matter disclosed herein relates to the formation of integrated circuits, and, more particularly, to the formation of transistors having strained channel regions by using strain-inducing sources, such as an embedded strained layer in the drain and source regions to enhance charge carrier mobility in the channel region of a MOS transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. Since the continuous size reduction of the critical dimensions, i.e., the gate length of the transistors, necessitates the adaptation and possibly the new development of highly complex process techniques, for example, for compensating for short channel effects, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, compressive strain in the channel region may increase the mobility of holes, thereby providing the potential for enhancing the performance of P-type transistors. On the other hand, the creation of tensile strain in the channel region of an N-channel transistor may increase electron mobility. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

Therefore, in some approaches, the hole mobility of PMOS transistors is enhanced by forming a strained silicon/germanium layer in the drain and source regions of the transistors, wherein the compressively strained drain and source regions create strain in the adjacent silicon channel region. To this end, the drain and source extension regions of the PMOS transistors may be formed on the basis of ion implantation, while the deep drain and source junctions may be formed on the basis of a silicon/germanium layer that is selectively formed in respective recesses in the PMOS transistor by epitaxial growth techniques. Since the natural lattice spacing of silicon/germanium is greater than that of silicon, the epitaxially grown silicon/germanium layer, adopting the lattice spacing of the silicon, is grown under compressive strain, which is efficiently transferred to the channel region, thereby compressively straining the silicon therein. This integration scenario results in a significant performance gain of the P-channel transistors. However, the continuous demand for higher performance and increased packing density still requires a further performance gain, which may not be exclusively provided by the conventional approach based on the provision of strained semiconductor layers within the drain and source regions of the transistors, or by other concepts for introducing external stress into the channel regions, since other characteristics of the channel region, which may also significantly affect the electrical behavior thereof, may not be taken into consideration by the conventional technique.

The present disclosure is directed to various devices and methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for manufacturing enhanced field effect transistors, in which efficient strain engineering may be combined with an appropriate channel design in which the material composition within the channel region may be selected on the basis of desired electrical and other characteristics, thereby further enhancing the finally obtained conductivity of the respective transistor device. For this purpose, an appropriate semiconductor compound or semiconductor alloy may be locally formed in the respective channel regions so as to appropriately adjust the material characteristics thereof prior to forming the actual drain and source regions, which in some aspects may also be provided as a strained semiconductor material so as to obtain a synergetic combined effect of the enhancement of charge carrier mobility in the channel region caused by an external strain-inducing source and the additional material characteristics, such as reduced band gap energy, scattering effects of charge carriers and the like, provided by the material of the channel region. In some illustrative embodiments, the strained semiconductor material and the semiconductor alloy in the channel region may be formed in a common manufacturing process wherein the material composition may be selected on the basis of the strain-inducing capabilities and the additional electrical properties that may be provided by the semiconductor alloy itself. Consequently, an enhanced degree of flexibility may be achieved since a specific compromise with respect to the strain-inducing mechanism, which may be caused by taking into consideration the crystalline orientation of the base material with respect to other semiconductor devices, may be efficiently overcompensated for by an appropriate material composition which may enhance the electrical behavior in the channel region due its intrinsic electrical characteristics. In other cases, the advantages of a per se highly efficient strain-inducing mechanism may be further enhanced by additionally providing an appropriate material composition in the channel region. Moreover, the disclosed process technique provides a high degree of compatibility with presently successfully practiced manufacturing strategies and also provides the possibility of locally enhancing the electrical characteristics of different types of field effect transistors.

According to one illustrative embodiment disclosed herein, a semiconductor device comprises a first strained channel region including a first non-silicon species and at least one channel dopant species, wherein a concentration of the first non-silicon species is higher compared to a concentration of the at least one first channel dopant species. Furthermore, the semiconductor device comprises first strained drain and source regions including a first dopant species and a second non-silicon species that forms, in combination with silicon, a first strained semiconductor material.

According to another illustrative embodiment disclosed herein, a method comprises forming a first semiconductor alloy in a first active semiconductor region and forming a gate electrode above the first active semiconductor region that comprises the first semiconductor alloy. Finally, the method comprises forming drain and source regions of a first transistor in the first active semiconductor region.

According to yet another illustrative embodiment disclosed herein, a method comprises locally forming a strained semiconductor material in drain and source regions and a channel region of a field effect transistor. Furthermore, a gate electrode is formed above the strained semiconductor material and PN junctions are formed at an interface between the drain and source regions and the strained channel region.

BRIEF DESCRIPTION OF THE DRAWINGS

The disclosure may be understood by reference to the following description taken in conjunction with the accompanying drawings, in which like reference numerals identify like elements, and in which:

FIGS. 1$a$-1$d$ schematically illustrate cross-sectional views of a field effect transistor during various manufacturing stages wherein the channel region and the drain and source regions receive an appropriate semiconductor alloy in a silicon-based configuration according to illustrative embodiments disclosed herein;

FIG. 1$e$ schematically illustrates a further illustrative embodiment in which a semiconductor alloy is formed by implantation within an active semiconductor region;

FIG. 1$f$ schematically illustrates a cross-sectional view of a semiconductor device comprising two transistor types having different characteristics in their respective channel regions and drain and source regions according to yet other illustrative embodiments disclosed herein;

FIGS. 2$a$-2$e$ schematically illustrate cross-sectional views of a transistor element during various manufacturing stages in forming a strained semiconductor material in the drain and source regions while individually adjusting the material characteristics of the channel region according to further illustrative embodiments disclosed herein; and FIGS. 3$a$-3$b$ schematically illustrate cross-sectional views of a semiconductor device during the formation of a gate insulation layer within an excess portion of a previously formed semiconductor alloy according to yet other illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to semiconductor devices and manufacturing techniques in which the material characteristics of respective channel regions in field effect transistors are taken into consideration when applying an advanced strain-inducing mechanism in order to obtain an even further enhanced device performance. As is previously explained, a plurality of strain-inducing mechanisms are currently practiced in order to enhance the charge carry mobility in respective channel regions of silicon-based transistor elements. However, the material characteristics of respective semiconductor alloys, in combination with the strain-inducing mechanism, may also provide a significant increase in the transistor performance when the material is provided within the channel region. Moreover, by forming the respective PN junctions substantially entirely within an appropriately selected semiconductor alloy, additional advantages may be achieved. For instance, silicon/germanium alloys may be successfully used in combination with P-type transistors wherein, additionally, the reduced band gap energy of the silicon/germanium alloy may provide enhanced conductivity in the channel region when the respective material is also provided in the channel region. Furthermore, the strain may be additionally "directly" generated within the channel region, thereby also significantly contributing to an enhanced conductivity of the resulting transistor device. Due to the additional provision of a semiconductor alloy within the channel region, an increased degree of flexibility may be obtained with respect to a selection of appropriate materials, since a reduced strain generating effect may be readily compensated for by other additional material characteristics and the highly efficient generation of a respective strain even if it is generated with a reduced amount compared to currently practiced strain-inducing techniques.

In some illustrative embodiments, selective epitaxial growth techniques may be used for locally forming an appropriate semiconductor alloy in respective active regions prior to patterning the gate electrode and the gate insulation layer. Subsequently, the further manufacturing process may be continued on the basis of well-established manufacturing techniques, thereby providing a high degree of compatibility with existing strain engineering techniques.

In other illustrative embodiments, different types of strain-inducing materials may be formed in respective active semiconductor regions in order to individually enhance the transistor characteristics. For this purpose, for instance, an appropriate masking regime may be used to form appropriate recesses in the individual active semiconductor regions and, subsequently, respective epitaxial growth techniques may be used for forming the different types of semiconductor alloys in non-covered recesses. In other illustrative examples, implantation techniques may be used for introducing a desired atomic species to form an appropriate semiconductor alloy having the desired characteristics. Also, selective epitaxial growth techniques may be efficiently combined with implantation techniques in order to provide different types of strained semiconductor material when one of the components may not be efficiently provided by an implantation process due to a high required concentration. For instance, silicon/carbon and silicon/germanium may be efficiently provided on the basis of a combined manufacturing scheme including a selective epitaxial growth process for providing the high germanium concentration typically required for obtaining a desired level of strain, while carbon may be efficiently incorporated into respective silicon-based materials on the basis of appropriately designed implantation processes.

In still other illustrative embodiments, an enhanced degree of flexibility may be provided in that the strain semiconductor material in the drain and source regions may be formed separately with respect to a semiconductor alloy provided in the channel region so as to enable an individual adaptation of the channel characteristics with respect to superior band gap characteristics while, nevertheless, a highly efficient strain-inducing mechanism may be accomplished by providing an appropriate strained semiconductor material in the drain and the source regions.

It should be appreciated that the principles of the present invention are highly advantageous in the context of advanced transistor elements having a gate length of 100 nm and significantly less since, here, a significant improvement with respect to the drive current capability may be obtained while still well-established transistor configurations and process techniques may be used. Consequently, the performance of transistor elements formed on the basis of currently practiced technology nodes may be significantly enhanced and scalability of presently practiced manufacturing techniques may also be provided.

Figure 1A:
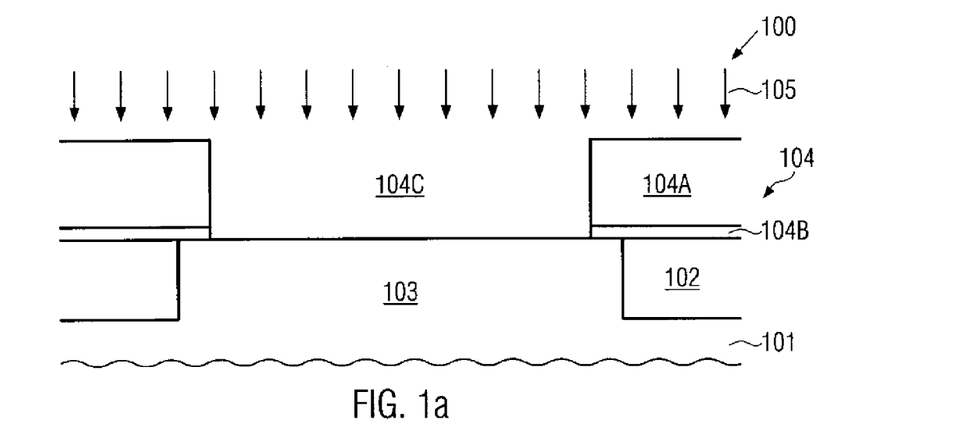

FIG. 1a schematically illustrates the cross-sectional view of a semiconductor device 100, which may comprise a substrate 101, representing any appropriate carrier material for forming thereabove a active semiconductor region 103. For example, the semiconductor substrate 101 may represent a crystalline semiconductor material having formed thereon an appropriate crystalline semiconductor layer, in which the active semiconductor region 103 may be defined, for instance, by respective isolation structures 102. In one illustrative embodiment, the substrate 101 may represent a silicon-based substrate which may be provided in the form of a bulk silicon substrate or a silicon-on-insulator (SOI) substrate, in which may be formed a silicon-based semiconductor layer on a buried insulating layer (not shown). It should be appreciated that a silicon-based semiconductor material is to be understood as a material incorporating a significant amount of silicon, for instance, 50 atomic percent or more, while other non-silicon species may also be present, however, with a reduced concentration compared to the silicon. As previously explained, complex integrated circuits, such as microprocessors, high density storage devices and the like, are currently and will be in the foreseeable future formed on the basis of silicon due to the high availability, the great amount of know-how with respect to the silicon processing and the like, wherein a local provision of other semiconductor materials, such as germanium, carbon, gallium arsenic or any other appropriate species, may allow locally adjusting the respective characteristics, for instance, with respect to strain, band gap and the like.

In the present disclosure, the local modification of the respective material characteristics may be applied to a significant portion of the active region 103 prior to the gate patterning process in order to also obtain the modified characteristics in a channel region still to be formed in the active semiconductor region 103. It should be noted that the term "active semiconductor region" may refer to a semiconductor region which may receive an appropriate dopant distribution in order to define respective PN junctions therein. For example, the active semiconductor region 103 may comprise a silicon-based semiconductor material, in and on which at least one transistor element may be formed which may laterally be separated from neighboring circuit elements by the isolation structure 102. For selectively modifying the material characteristics in the active semiconductor region 103, in one illustrative embodiment, an appropriate etch and growth mask 104 may be provided, which may expose a specific portion of the active semiconductor region 103 depending on the device and process requirements. The mask 104 may typically be formed of any appropriate material that may withstand an etch atmosphere 105 as well as a subsequent deposition atmosphere for epitaxially growing an appropriate semiconductor material after the removal of a specific portion of the semiconductor region 103. It should be appreciated that, although the isolation structure 102 may also act as an etch and growth mask, typically the mask 104 may have to cover other device regions, such as active semiconductor regions for different transistor types and the like, so that the corresponding deposition of the semiconductor material may be reliably avoided. Furthermore, the etch and growth mask 104 may define an appropriate opening 104C so as to expose a desired portion of the semiconductor region 103. For example, if a certain amount of laterally located "template" material may be desired, the respective opening 104C may be formed so as to expose a lateral portion of the region 103 while covering respective edge portions, the finally obtained size of which may also be determined by the characteristics of the etch process 105. That is, depending on the degree of isotropy of the etch process 105, a more or less pronounced degree of under-etching may be achieved. The etch and growth mask 104 may comprises an etch stop layer 104B and an actual mask layer 104A so as facilitate a subsequent removal of the mask 104 in a later manufacturing stage. For instance, the mask layer 104A may be comprised of silicon nitride, while the etch stop layer 104B may be provided in the form of silicon dioxide. It should be appreciated, however, that any other appropriate material may be used for the mask 104 as long as the mask 104 may be selectively removed with respect to a semiconductor material still to be formed within the active semiconductor region 103.

A typical process flow for forming the semiconductor device 100 as shown in FIG. 1a may comprise the following processes. After providing the substrate 101 having formed thereon a respective semiconductor layer, such as a silicon-based semiconductor layer, in some illustrative embodiments, the isolation structure 102 may be formed, which may be accomplished on the basis of well-established trench isolation techniques involving advanced photolithography, etch, deposition and planarization processes. For example, when an SOI architecture is considered, respective isolation trenches may be formed in the respective semiconductor layer down to a buried insulating layer, thereby defining the dimensions of the active semiconductor region 103. In embodiments representing a bulk transistor configuration, the respective isolation trenches may extend down to a specified depth so as to define the region 103. After forming the respective isolation trenches, an appropriate material, such as silicon dioxide, silicon nitride and the like, may be formed in the trench openings, wherein any excess material may be subsequently removed on the basis of well-established planarization techniques, such as chemical mechanical polishing (CMP) and the like.

Thereafter the mask 104 may be formed, for instance, on the basis of well-established deposition techniques for forming the etch stop layer 104B, if required, followed by the deposition of the mask layer 104A. For instance, plasma enhanced chemical vapor deposition (PECVD) recipes are well established in the art for a plurality of appropriate dielectric materials such as silicon dioxide, silicon nitride and the like. It should be appreciated that the etch stop layer 104B, if provided, may also be formed by an oxidation process. Next, a corresponding lithography process may be performed to form an etch mask, such as a resist mask, for patterning the mask layer 104A to receive the opening 104C. Providing the etch stop layer 104B in this manufacturing stage may be advantageous in appropriately controlling the corresponding etch process so that a non-controlled material removal in the active region 103 during the patterning of the mask layer 104A may be substantially avoided. Consequently, after opening the etch stop layer 104B and establishing the etch atmosphere 105, a high degree of uniformity of the process 105 may be obtained across the entire substrate 101. The etch process 105 may be performed on the basis of a well-established etch chemistry having a high degree of selectivity with respect to the mask 104 in order to efficiently remove material from the active region 103.

Figure 1B:
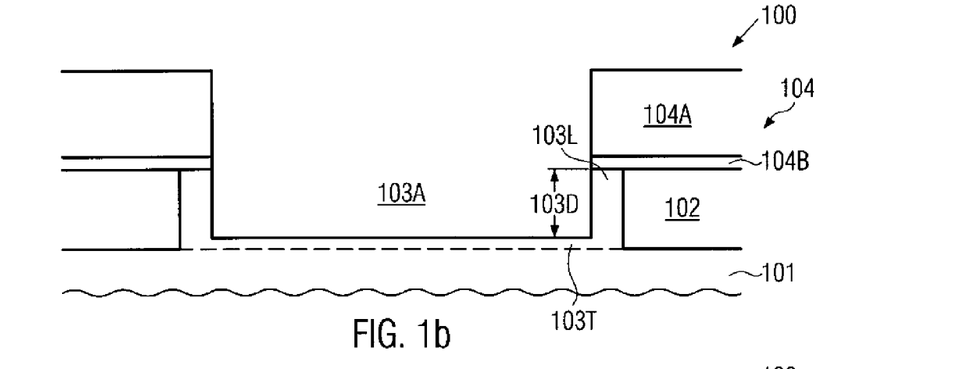

FIG. 1b schematically illustrates the semiconductor device 100 after the completion of the etch process 105. Hence, a respective opening 103A is formed in the active semiconductor region 103, wherein, as previously explained, the respective shape and size of the opening 103A may be controlled on the basis of the dimensions of the opening 104C and the characteristics of the etch process 105. For example, a highly anisotropic etch recipe may be used if respective lateral portions 103L may be required for the further processing of the device 100. In other illustrative embodiments, a moderately high degree of isotropy may be selected in the process 105 when substantially the entire surface area of the region 103 is to be removed, wherein minor alignment inaccuracies may not be relevant, since the isotropic behavior may nevertheless remove the lateral portions 103L, while, on the other hand, any exposed portions of the isolation structures 102 may also have a high degree of etch selectivity, thereby substantially preventing a significant material removal of the isolation structure 102. The depth 103D of the opening 103A may be adjusted such that a sufficient amount of template material 103T may still be maintained within the active region 103, in particular when SOI configurations are considered. For example, a residual thickness of the template material at the bottom of the opening 103A may range from approximately 1 nm to several nanometers in sophisticated SOI applications. In this case, a high degree of uniformity of the etch process 105 may be achieved by, for instance, using the etch stop layer 104B to define a uniform starting point of the etch process 105, thereby providing a corresponding reliability in maintaining the material 103T. Next, the device 100 shown in FIG. 1b may be prepared for a subsequent selective epitaxial growth process. For example, contaminations resulting from the preceding etch process may be removed on the basis of well-established cleaning processes.

Figure 1C:
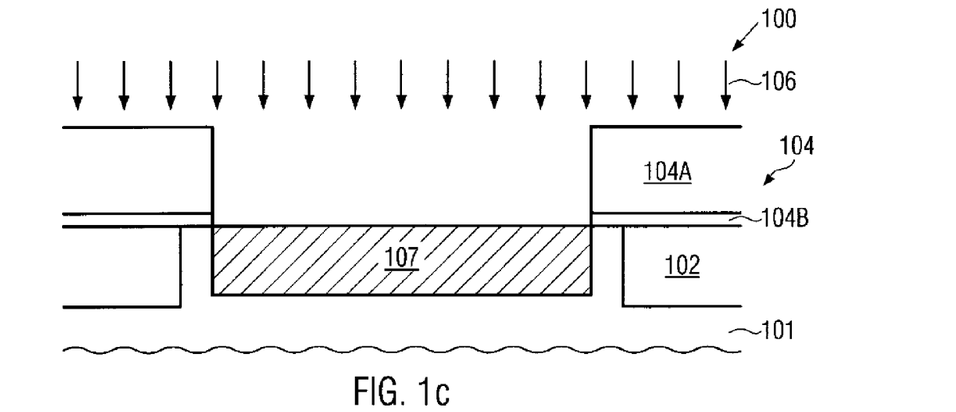

FIG. 1c schematically illustrates the semiconductor 100 during a selective epitaxial growth process 106, during which the opening 103A may be filled to a desired level by an appropriate semiconductor material which may be provided as a semiconductor alloy when the material 103T represents a silicon-based material. In one illustrative embodiment, the semiconductor material 107 may be formed as a silicon/germanium alloy having a desired mixture ratio in order to provide the required material characteristics. For instance, a concentration of germanium up to approximately 30 atomic percent may provide high internal strain, since the material

107 may be grown on the template material 103T, thereby substantially adapting to the crystalline structure of the material 103T. In the case of a silicon/germanium material, the corresponding lattice spacing of the material 107 may be reduced compared to the natural lattice spacing of silicon/germanium, thereby forming a compressive strained semiconductor alloy. Since, generally, silicon/germanium material may have a reduced band gap compared to silicon, an enhanced conductivity may be obtained, which may also be provided in a channel region still to be formed in the active semiconductor region 103 having the epitaxially grown material 107. Moreover, since, for instance, scattering events may be reduced in a silicon/germanium material compared to a silicon material, an even more enhanced conductivity may be obtained for a silicon/germanium channel region compared to a silicon channel region of conventional advanced transistors.

Since a plurality of different material characteristics may simultaneously affect the overall conductivity of the channel region still to be formed, the amount of strain provided by the material 107 may not represent the dominant aspect as is the case in conventional approaches, wherein the strained silicon/germanium material is solely provided for inducing strain in the neighboring silicon channel region. Rather, the magnitude of strain may be one of a plurality of factors, which in combination may provide the desired performance increase. For example, a reduced germanium concentration may be used while still obtaining increased transistor performance due to the modified channel region, thereby also providing enhanced flexibility with respect to the further processing of the device 100. For example, a very high germanium concentration may result in reliability issues during the further processing of the device 100, for instance, with respect to the formation of the metal silicides after completing the transistor, the formation of an appropriate gate insulation layer and the like.

In still other illustrative embodiments, the epitaxial growth 106 may be performed on the basis of any appropriate precursor materials in order to provide the material 107 having a desired mixture ratio. For instance, if a silicon/carbon mixture is considered appropriate for the devices under consideration, a respective semiconductor material 107 having a tensile strain may be formed. It should be appreciated that, in view of the further processing of the device, the material 107 may be provided with an appropriate fill height, which, in some illustrative embodiments, represents at least a height level that corresponds to the height of the isolation structures 102. Thus, contrary to conventional approaches, any height differences between the active region 103 as shown in FIG. 1a and the isolation structures 102 may be compensated for or at least reduced by providing the material 107 up to the height of the isolation structure 102. In some cases, even a certain amount of excess material may be provided, which may thereafter be removed to obtain a surface topography of enhanced planarity. After the epitaxial growth process 106, the mask 104 may be removed, wherein an appropriate etch chemistry may be used having a desired degree of etch selectivity with respect to the material 107. For instance, if silicon/germanium is considered, respective selective etch recipes are well-established in conventional techniques for embedded silicon/germanium materials. In other illustrative embodiments, when a corresponding etch chemistry may not be available that may provide the desired high degree of selectivity, a sacrificial material (not shown) may be formed to cover the material 107. This may, for instance, be accomplished by depositing a respective material, such as a polymer material, and removing excess material thereof so as to reliably expose the mask 104 while still covering the material 107. Thereafter, a respective etch process may be performed for removing the mask 104, wherein the material 107 may be reliably protected by the overlaying sacrificial material. In this case, a pronounced selectivity between the sacrificial material and the etch mask 104 may not be necessary as long as these materials have a comparable etch rate during the process under consideration. After the removal of the etch mask 104, an appropriate planarization process may be performed as previously described, which may be accomplished on the basis of a CMP process and the like. Consequently, the further processing, for instance, the gate patterning process, may be performed on a substantially planar surface.

Figure 1D:
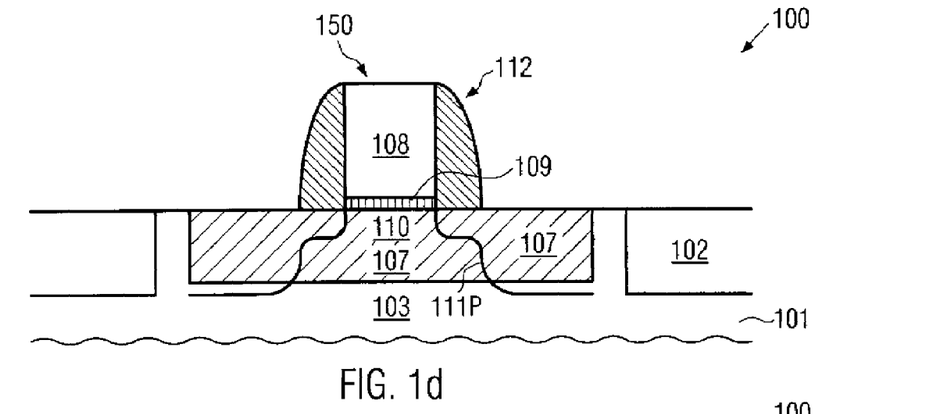

FIG. 1d schematically illustrates the semiconductor device 100 in a further advanced manufacturing stage. A transistor 150 is formed in and above the active semiconductor region 103 comprising the semiconductor material 107. The transistor 150 may comprise a gate electrode 108 formed on a gate insulation layer 109 which separates the gate electrode 108 from a respective channel region 110. Furthermore, a spacer structure 112 may be formed on sidewalls of the gate electrode 108 and respective drain and source regions 111 having a respective vertical and lateral dopant profile may be formed in the active semiconductor region 103 and thus also in the semiconductor material 107.

The semiconductor device 100 as shown in FIG. 1d may be formed according to the following processes. Prior to or after the removal of the etch mask 104, a respective vertical dopant profile may be established in the active region 103 and thus within the epitaxially grown semiconductor material 107 as is required for adjusting the channel dopant concentration. For example, during the epitaxial growth process 106, a certain required basic dopant concentration may be incorporated into the material 107 in order to provided specific well doping, if required, wherein a corresponding channel dopant concentration may be established on the basis of an appropriately designed implantation process. In other cases, any appropriate implantation sequence may be performed to establish the required vertical dopant concentration within the active semiconductor region 103. It should be appreciated that, in some illustrative embodiments, the respective implantation process may be performed prior to the removal of the etch mask 104 which may thus be used as an efficient implantation mask so as protect other device regions, such as other transistor regions which may require a different type of channel dopant. Thereafter, the etch mask 104 may be removed as is previously described or the further processing may be continued on the basis of a masking regime as particularly used for forming respective channel dopants in a conventional CMOS strategy. Next, the gate insulation layer 109 may be formed wherein, in some illustrative embodiments, any appropriate deposition technique may be used, for instance, when the material 107 may not form an appropriate native oxide which may typically be used in conventional silicon-based CMOS techniques.

For instance, the gate insulation layer 109 may be formed by any appropriate material, such as a high-k material, wherein appropriate techniques are available in the prior art for forming the gate insulation layer 109 on materials that may not form native oxides, and these techniques may also be applied in the present embodiments. Similarly, if other dielectric materials may be used, such as silicon nitride and the like, the corresponding manufacturing sequence may be based on established techniques for forming dielectric materials on a silicon-based channel region so as to finally obtain a stable interface between the channel region 110 and the gate insulation 109. In still other illustrative embodiments, an oxide-based material may be formed, wherein the material 107 may form a stable native oxide. In other illustrative embodiments, a silicon dioxide based gate insulation 109 may be formed as will be described in more detail with reference to FIGS. 3a-3b. Next, the gate electrode 108 may be formed on the basis of well-established techniques, for instance comprising the deposition of an appropriate gate electrode material, such as polysilicon and the like, followed by an appropriate patterning process including advanced lithography and etch techniques. Thereafter, the drain/source regions 111 may be defined by implanting an appropriate dopant species, wherein the sidewall spacer structure 112 may provide the appropriate masking regime depending on the required complexity of the vertical and lateral dopant profile of the regions 111. It should further be appreciated that any other implantation sequences, such as halo implantation and an amorphization implantation and the like, may also be performed as required in order to obtain the desired characteristics of the drain and source regions 111. Furthermore, appropriate anneal processes, such as laser-based, flash-based anneal processes, or any other similar rapid anneal processes, may be performed in order to activate dopants in the drain and source regions 111 and also re-crystallize implantation-induced lattice damage. Furthermore, appropriate silicidation processes may be performed, if respective silicide regions of enhanced conductivity are required in the drain and source regions 111 and the gate electrode 108.

Consequently, the transistor 150 may comprise the semiconductor material 107, which may represent any appropriate material such as silicon/germanium, gallium/arsenic, silicon/carbon and the like, which may provide an appropriate strain in the channel region 110 while also providing respective characteristics with respect to charge carrier scattering, band gap energy and the like. For example, the respective PN junctions 111P may have a substantial portion that is formed within the material 107 so that the corresponding junction characteristics may be efficiently designed by selecting the composition of the material 107.

Figure 1E:
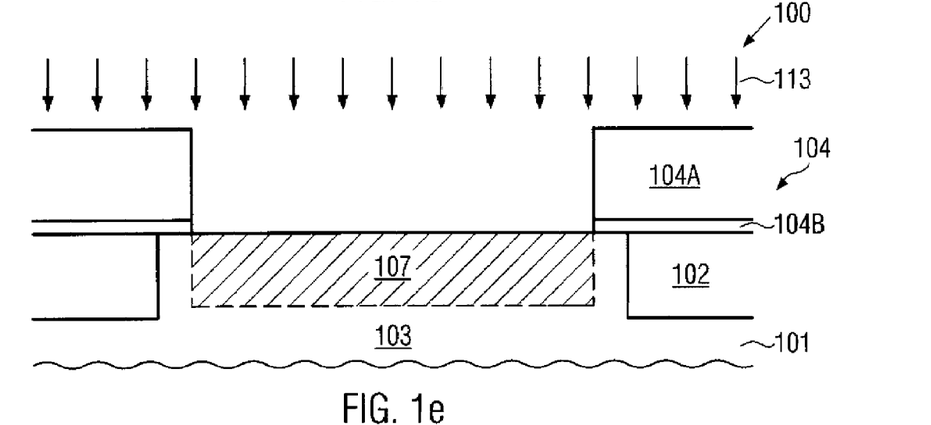

FIG. 1e schematically illustrates the semiconductor device 100 according to a further illustrative embodiment, in which the semiconductor alloy 107 may be formed on the basis of an implantation process 113. In some illustrative embodiments, the implantation process 113 may be efficiently combined with a selective epitaxial growth process when different types of semiconductor alloys are to be formed. In FIG. 1e, the device 100 may comprise the mask 104, which may expose a desired portion of the entire active semiconductor region 103. Since the implantation process 113 may be performed substantially at room temperature, the implantation mask 104 may be provided in the form of a resist mask, thereby significantly reducing the process complexity for forming the semiconductor alloy 107. For example, if a moderately low concentration of a non-silicon species may already provide the desired strain and other characteristics, appropriate implantation parameters for the process 113 may be readily obtained on the basis of simulation or engineering experience in order to provide the material 107 within the semiconductor region 103. For instance, if a silicon/carbon material is considered appropriate for the semiconductor alloy 107, a respective carbon concentration may be introduced by the process 113, wherein, additionally, a pre-amorphization implantation may be performed prior to actually incorporating the carbon species. In other embodiments, materials having a high covalent radius compared to germanium may be incorporated by implantation, wherein a concentration obtained by implantation may be sufficient for achieving the desired characteristics. Prior to or after the implantation process 113, and prior to a respective anneal process, in some illustrative embodiments, the required channel dopant may also be introduced into the active region 103, wherein an optional pre-amorphization may result in an increased implantation uniformity. It should be appreciated that a corresponding pre-amorphization step may be performed such that a specified portion of the semiconductor region 103 may be maintained in its crystalline state. After forming the semiconductor alloy 107 on the basis of the implantation process 113, the mask 104 may be removed and the further processing may be continued as is also described with reference to FIG. 1d.

Figure 1F:
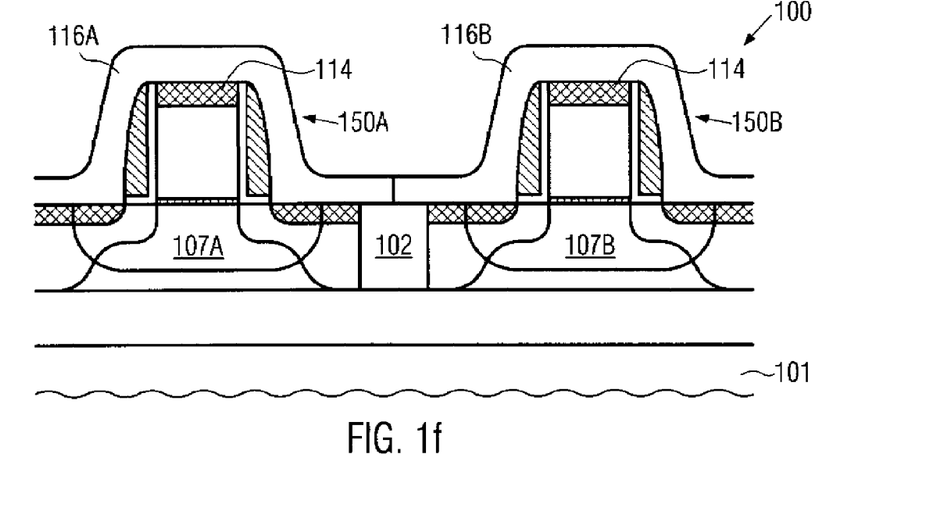

FIG. 1f schematically illustrates the semiconductor device 100 according to a further illustrative embodiment. In this case, the semiconductor device 100 may comprise a first transistor 150A and a second transistor 150B, each of which may be formed in accordance with one of the manufacturing techniques previously described with reference to the transistor 150. Thus, each of the transistors 150A, 150B may comprise a respective semiconductor alloy 107A, 107B, respectively, which are selected so as to individually enhance the performance of the transistors 150A and 150B. For example, the semiconductor alloy 107A may represent a strained semiconductor material for enhancing the performance of P-channel transistors, while the semiconductor alloy 107B may represent the material of an N-channel transistor. In other cases, the materials 107A, 107B may be of substantially the same type wherein, however, the concentration ratio may be adjusted differently in order to obtain a different degree of performance increase in the transistors 150A, 150B. For example, when forming the respective materials 107A, 107B on the basis of a selective epitaxial growth process, respective recesses such as the openings 103A (FIG. 1b) may be formed commonly or separately, wherein, prior to a respective selective epitaxial growth process, the opening for one of the transistors 150A, 150B may be covered while the other opening may be filled with the desired material 107A, 107B. Thereafter, a further appropriate mask regime may be used for filling the non-filled recess while covering the previously filled active semiconductor region. In other illustrative embodiments, an appropriate mask regime may be used when the respective material 107A, 107B may be formed on the basis of one ion implantation process. In still other illustrative embodiments, one of the semiconductor alloys 107A, 107B may be formed on the basis of a selective epitaxial growth process while the other one of the materials 107A, 107B may be formed on the basis of an implantation process such as the process 113 previously described. Consequently, a high degree of flexibility in individually adapting the performance of transistor elements may be achieved.

As illustrated, in some illustrative embodiments, respective metal silicide regions 114 may be formed in the transistors 150A, 150B when an additional increase of conductivity is required. In still other illustrative embodiments, respective stressed overlayers 116A and 116B may be provided, which may have the same or a different type of intrinsic stress depending on the conductivity type of the transistors 150A, 150B. Thus, the provision of an appropriate semiconductor alloy such as the alloys 107A, 107B in the respective channel regions may be efficiently combined with other strain-inducing mechanisms so as to further increase the performance of the respective transistors.

With reference to FIGS. 2a-2d, further illustrative embodiments will now be described in more detail, in which the material composition within the channel region and the drain and source regions may be adjusted separately in order to provide enhanced flexibility in designing the transistor characteristics.

Figure 2A:
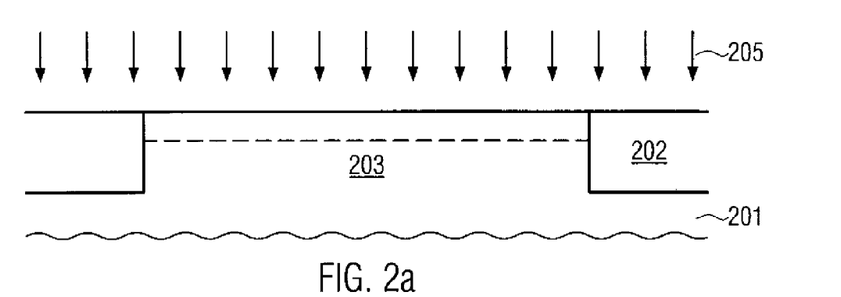

In FIG. 2a, a semiconductor device 200 may comprise a substrate 201, above which may be defined an active semiconductor region 203 on the basis of a respective isolation structure 202. With respect to the components 201, 202 and 203, the same criteria apply as previously discussed with reference to the device 100. Moreover, the semiconductor 200 is exposed to an etch ambient 205 in order to selectively remove a certain amount of material from the active semiconductor region 203, as indicated by the dashed line. It should be appreciated that a respective etch mask may be provided above other device regions, as is described with reference to the mask 104 in FIG. 1a, in which a respective material removal may not be desired. When the etch process 205 may comprise a sufficient selectivity with respect to the isolation structure 202, the respective etch mask may also expose the isolation structures 102 as is shown in FIG. 2a. It should be appreciated that, in some illustrative embodiments, the active semiconductor region 203 may be defined in a later manufacture stage by first forming the desired semiconductor alloy in appropriate device areas and subsequently forming the isolation structures 202. Irrespective of the specific manufacturing strategy, material of the region 203 may be removed down to a specified depth by the process 205 and subsequently an epitaxial process may be performed.

Figure 2B:
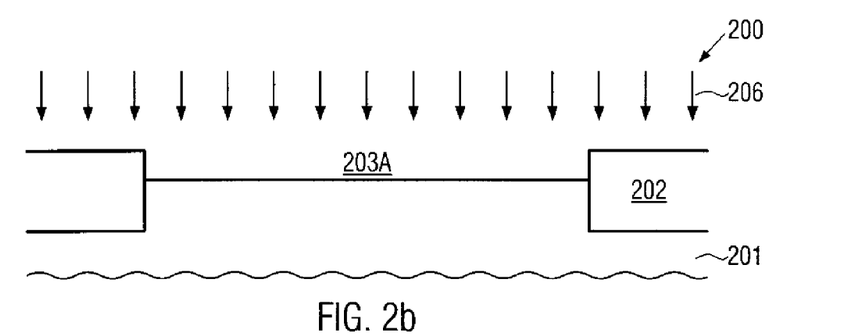

FIG. 2b schematically illustrates the semiconductor device 200 after the completion of the etch process 205 and during an epitaxial growth process 206, in which a desired semiconductor alloy may be selectively deposited into an opening 203A formed during the preceding etch process 205. For example, if a specific semiconductor alloy may be required for adjusting respective characteristics of the channel conductivity, while a different material may be required in the drain and source regions for obtaining a desired strain characteristic, the growth process 206 may be performed so as to deposit the desired material composition tailored for the channel characteristics. For instance, in some illustrated embodiments, it may be advantageous to provide a silicon/germanium alloy with a moderately low germanium concentration while nevertheless a high degree of tensile or compressive strain may be required in the respective channel region. In this case, a silicon/germanium material having an appropriate concentration ratio may be deposited during the process 206, wherein, generally, the process 206 may be performed as previously described with reference to the device 100.

Figure 2C:
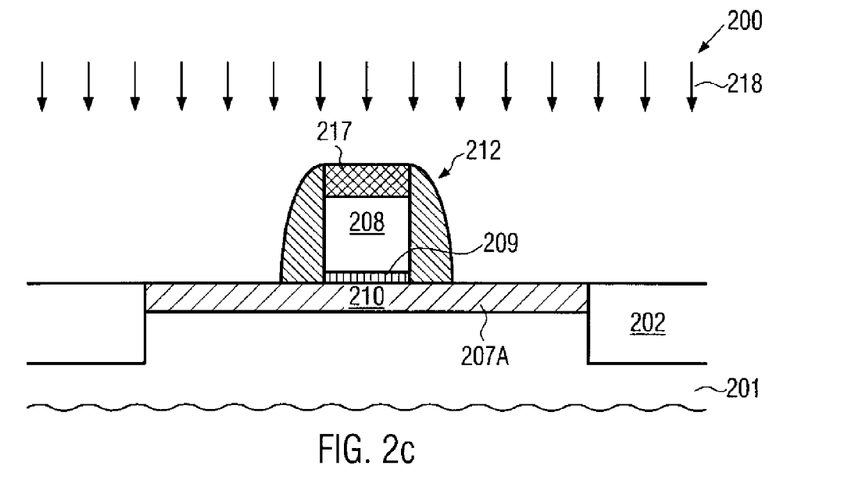

FIG. 2c schematically illustrates the semiconductor device 200 in a further advanced manufacturing stage, wherein the respective opening 203A may be filled with a semiconductor alloy 207A having the material composition as required for a channel region still to be formed. Furthermore, in this manufacturing stage, the device 200 may comprise a gate electrode 208 which may be formed on a gate insulation layer 209 that separates the gate electrode 208 from the channel region 210. Furthermore, although not shown, a corresponding vertical dopant profile may be formed in the semiconductor region 203 and the channel region 210 in accordance with device requirements. Furthermore, a spacer structure 212 may be formed on sidewalls of the gate electrode 208 and a capping layer 217 may be provided so that the gate electrode 208 may be encapsulated by the spacer 212 and the capping layer 217. Furthermore, the device 200 may be exposed to an etch ambient of a cavity etch process 218 in order to form respective recesses adjacent to the encapsulated gate electrode 208. It should be appreciated that other device regions may be reliably covered by a corresponding etch mask (not shown) in order to protect these device regions from the etch ambient 218. During the etch process 218, exposed portions of the material 207A and, if required, material of the remaining semiconductor region 203 may be removed.

Figure 2D:
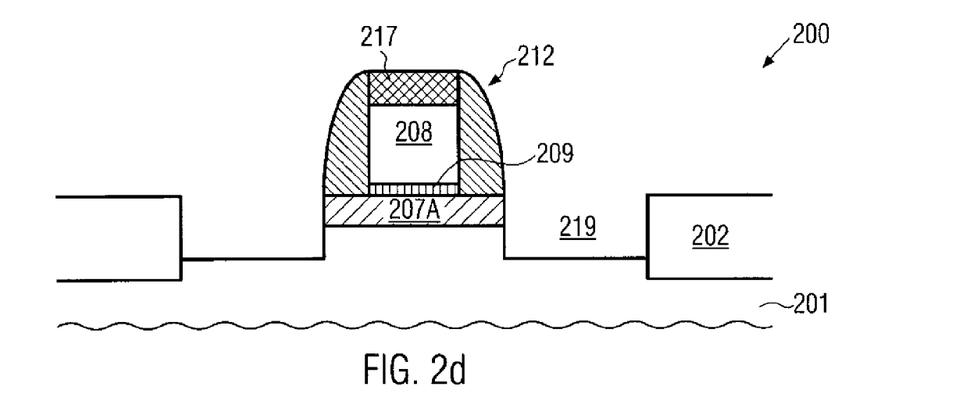

FIG. 2d schematically illustrates the semiconductor device 200 after the completion of the etch process 218. Hence, a respective recess or cavity 219 may be formed within the material 207A and the semiconductor region 203. It should be appreciated that the depth of the recess 219 may be selected independently with respect to a thickness of the material 207A, thereby providing increased flexibility in adjusting the vertical configuration of the channel region 210 and of the drain and source regions still to be formed. For example, when the vertical dopant profile within the channel region 210 may be formed on the basis of the selective epitaxial growth process 206, an appropriate dopant concentration may be incorporated during the process 206, wherein the vertical progression of the dopant concentration may be controlled on the basis of the etch depth and the deposition characteristics. For instance, if a respective retrograde dopant concentration may be required that gradually decreases over an extended height, the corresponding recess 203A may be provided with a respective increased height and the dopant concentration during the formation of the semiconductor alloy 207A may be controlled in an appropriate manner during the deposition process. Similarly, if a specific threshold dopant is required, the required dopant concentration may be incorporated at a specific height during the deposition process. It should be appreciated that a corresponding adaptation of the channel dopant concentration may also be accomplished for the device 100, thereby requiring a subsequent implantation process for defining the drain and source regions. After forming the recess 219, the device 200 may be prepared for a further selective epitaxial growth process for forming a desired semiconductor alloy that provides the required strain characteristics.

Figure 2E:
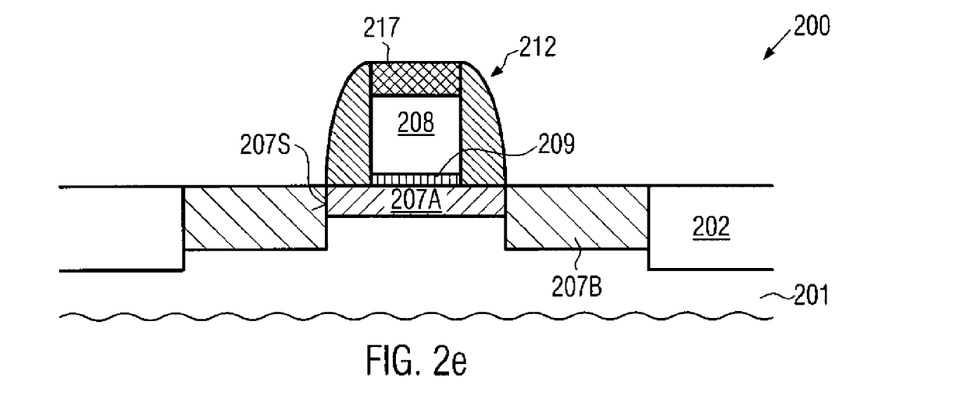

FIG. 2e schematically illustrates the semiconductor device 200 after the completion of the selective epitaxial growth process, thereby providing a second semiconductor alloy 207B in the semiconductor region 203. For example, the semiconductor alloy 207B may be formed from a material composition providing the desired strain characteristics. Hence, the channel characteristics and the strain-inducing mechanism may be realized in a substantially independent manner. It should be appreciated that an interface 207S which may be subjected to an increased amount of lattice defects may be positioned such that respective PN junctions still to be formed in the active region 203 may not be significantly affected by the interface 207S. This may be accomplished by appropriately selecting a lateral offset of the interface 207S with respect to the gate electrode 208. For instance, if the material 207A is provided as a silicon/germanium material and the material 207B is provided as a silicon/carbon mixture, an advantageous behavior with respect to band gap and scattering behavior of the channel region 210 may be obtained, while the material 207B provides an efficient tensile or compressive strain in the channel region 210, which may lead to an "overcompensation" of the silicon/germanium material in the channel region 210. It should be appreciated that the above manufacturing sequence may be performed in a similar fashion when one or more implantation processes may be used instead of one or more of the selective epitaxial growth processes. For instance, the material 207A may be formed on the basis of a selective epitaxial growth process as described, while the material 207B may be formed on the basis of an implantation sequence similarly as described with reference to the process 113.

Figure 3A:
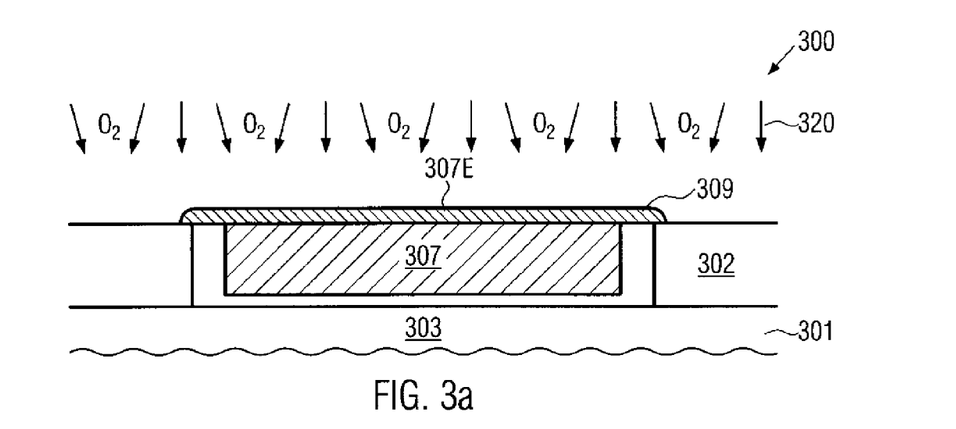
Figure 3B:
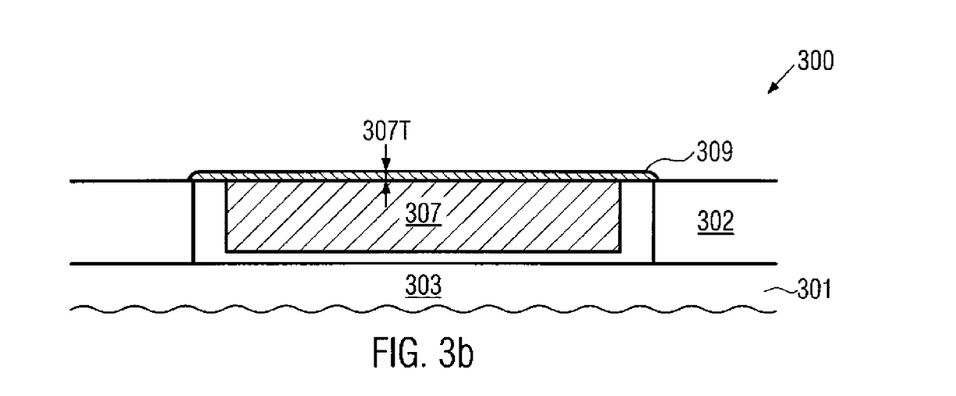

With reference to FIGS. 3a-3b, further illustrative embodiments will now be described, wherein a gate insulation layer may be formed on top of a semiconductor alloy on the basis of well-established techniques.

In FIG. 3a, a semiconductor device 300 may comprise a substrate 301 having formed therein an active semiconductor region 303, which may be defined by an isolation structure 302. Furthermore, a semiconductor alloy 307 may be formed within the active semiconductor region 303, wherein the size and the material composition of the semiconductor alloy 307 may be selected in accordance with device requirements. With respect to the components 301, 302 and 303, the same criteria apply as previously explained with reference to the devices 100 and 200. Furthermore, a portion 307E of excess material is formed above the semiconductor alloy 307 and has a different material composition so as to enable the formation of an appropriate gate insulation layer to obtain superior characteristics with respect to thermal stability and the like. In one illustrative embodiment, the excess portion 307E may be comprised of silicon so as to enable the application of well-established techniques for forming a highly uniform insulating layer in the excess portion 307E.

The device 300 may be formed on the basis of processes as previously explained with reference to the devices 100 and 200. For example, the semiconductor alloy 307 may be formed in accordance with any of the processes previously described. Thereafter, the excess portion 307E may be formed on the basis of a selective epitaxial growth process or any other appropriate deposition technique, wherein, depending on the crystallinity of the deposited material, a subsequent re-crystallization process may be performed. For example, after forming the semiconductor alloy 307 by epitaxy, implantation and the like, and after the removal of any masks, such as an etch and growth mask or an implantation mask, the excess portion 307E may be formed on the basis of an epitaxial growth process, wherein, optionally, prior to the growth process, a surface planarization process may be performed. Thereafter, the device 300 may be exposed to an oxidizing ambient 320 in order to form a base oxide material, which may be subsequently treated in any appropriate manner, for instance, by incorporating nitrogen, so as to obtain the desired material characteristics. In some embodiments, the excess portion 307E may provide a desired thickness of the gate insulation layer 309 after the oxidation process 320, while, in other embodiments, a further treatment may be performed so as to obtain the desired final thickness of the gate insulation layer 309.

FIG. 3b schematically illustrates the semiconductor device 300, wherein an initial thickness of the layer 309 may be reduced, for instance, by a highly controllable atomic layer etch process and the like, in which a highly controllable material removal may be accomplished so as to finally adjust the target thickness 307T of the gate insulation layer 309. It should be appreciated that not necessarily the entire material of the excess portion 307E may be converted into an insulating material during the process 320 so that, below the respective gate insulation layer 309, a minor amount of material of the initial excess portion 307E may be provided, which may, however, not significantly affect the overall behavior of a respective channel region to be formed in the semiconductor alloy 307. In some illustrative embodiments, a thin semiconductor layer, for instance, a silicon layer, may be intentionally maintained during the formation of the gate insulation layer 309, thereby providing increased surface stability while nevertheless providing enhanced conductivity characteristics of a channel region to be formed in the semiconductor alloy 307. It should be appreciated that highly controllable processes, such as the oxidation process 320, which may be optionally combined with a highly controllable removal process, may be applied, thereby providing a high degree of controllability and compatibility relative to presently performed process techniques. Consequently, in this way, well-established techniques for forming a reliable gate insulation layer on the basis of well-established methods may be combined with the formation of a channel region on the basis of a semiconductor alloy having the desired characteristic as previously described.

As a result, the subject matter disclosed herein provides a technique for forming advanced field effect transistors, wherein material characteristics of semiconductor alloys may be taken advantage of in the respective channel regions so that, in combination with additional strain-inducing mechanisms, such as a strained semiconductor material, an increased overall performance may be achieved. For this purpose, an appropriate semiconductor alloy may be formed in an active semiconductor region prior to the patterning of a gate electrode, wherein, in illustrative embodiments, the semiconductor region comprises a silicon-based material. Consequently, advantages with respect to band gap characteristics and scattering behavior and the like may be obtained in the channel region, while nevertheless a strained semiconductor material may be provided in the respective drain and source regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a mask layer patterned to expose a portion of a first active semiconductor region;
   forming a first semiconductor alloy in said exposed portion of said first active semiconductor region;
   removing said mask layer;
   forming a gate electrode above said first active semiconductor region comprising said first semiconductor alloy; and
   forming drain and source regions of a first transistor in said first active semiconductor region.

2. The method of claim 1, wherein forming said drain and source regions comprises forming a strained semiconductor material in said first active semiconductor region.

3. The method of claim 1, wherein forming said first semiconductor alloy comprises forming a recess in said first active semiconductor region and filling said first semiconductor alloy in said recess.

4. The method of claim 1, wherein forming said first semiconductor alloy comprises implanting at least one species into said first active semiconductor region.

5. The method of claim 1, further comprising introducing a first channel dopant into said first semiconductor alloy.

6. The method of claim 5, wherein said first channel dopant is introduced by in situ doping during a deposition process for forming said first semiconductor alloy.

7. The method of claim 1, further comprising forming an excess portion above said first semiconductor alloy, said excess portion having a different material composition relative to said first semiconductor alloy.

8. The method of claim 7, further comprising forming a gate insulation layer in said excess portion.

9. The method of claim 1, further comprising forming a second semiconductor alloy in a second active semiconductor region prior to forming said gate electrode of the first transistor, said second semiconductor alloy differing from said first semiconductor alloy.

10. A method, comprising:

forming a mask layer patterned to expose a portion of a first active semiconductor region;

locally forming a strained semiconductor material in said exposed portion of said first active semiconductor region;

removing said mask layer;

forming drain and source regions and a channel region of a field effect transistor in said strained semiconductor material;

forming a gate electrode above said strained semiconductor material, and forming PN junctions at an interface between said drain and source regions and said channel region.

11. The method of claim 10, wherein forming said strained semiconductor material comprises performing at least one of a selective epitaxial growth process and an implantation process.

* * * * *